United States Patent
Roan et al.

(10) Patent No.: US 11,594,468 B2
(45) Date of Patent: Feb. 28, 2023

(54) EVAPORATOR STACKS AND ELECTRONIC ASSEMBLIES

(71) Applicants: Deere & Company, Moline, IL (US); Alliance for Sustainable Energy, LLC, Golden, CO (US)

(72) Inventors: Thomas J. Roan, Fargo, ND (US); Brij N. Singh, West Fargo, ND (US); Gilberto Moreno, Thornton, CO (US); Kevin Scott Bennion, Littleton, CO (US)

(73) Assignees: DEERE & COMPANY, Moline, IL (US); ALLIANCE FOR SUSTAINABLE ENERGY, LLC, Golden, CO (US)

( * ) Notice: Subject to any disclaimer, the term of this patent is extended or adjusted under 35 U.S.C. 154(b) by 104 days.

(21) Appl. No.: 17/018,255

(22) Filed: Sep. 11, 2020

(65) Prior Publication Data
US 2021/0320047 A1    Oct. 14, 2021

Related U.S. Application Data

(63) Continuation-in-part of application No. 16/870,320, filed on May 8, 2020, now Pat. No. 11,388,840.

(60) Provisional application No. 63/009,789, filed on Apr. 14, 2020.

(51) Int. Cl.
| | |
|---|---|
| *H01L 23/427* | (2006.01) |
| *H01L 23/433* | (2006.01) |
| *F28D 15/02* | (2006.01) |
| *F28D 15/04* | (2006.01) |

(52) U.S. Cl.
CPC ........ *H01L 23/427* (2013.01); *F28D 15/0233* (2013.01); *H01L 23/4332* (2013.01); *F28D 15/0266* (2013.01); *F28D 15/046* (2013.01)

(58) Field of Classification Search
CPC ............... H01L 23/427; H01L 23/4332; F28D 15/0233; F28D 15/0266; F28D 15/046
See application file for complete search history.

(56) References Cited

U.S. PATENT DOCUMENTS

| | | | |
|---|---|---|---|
| 6,609,561 B2 * | 8/2003 | Sauciuc ................ | H01L 23/427 165/80.4 |
| 7,958,935 B2 | 6/2011 | Belits et al. | |
| 10,153,226 B1 | 12/2018 | Zou | |
| | (Continued) | | |

FOREIGN PATENT DOCUMENTS

DK    3052864 T3    3/2019

OTHER PUBLICATIONS

Extended European Search Report dated Jul. 26, 2021 issued in corresponding European Patent Application No. 21153940.8-1002.
(Continued)

*Primary Examiner* — Joel M Attey
(74) *Attorney, Agent, or Firm* — Harness, Dickey & Pierce, P.L.C.

(57) ABSTRACT

Provided is an evaporator stack. The evaporator stack may be used in power-dense electronic assemblies. The evaporator stack includes a lower floor including at least one mounded portion, and an enclosure surrounding the lower floor, wherein a height of the enclosure is greater than a height of the at least one mounded portion, the at least one mounded portion extending between two walls of the enclosure.

19 Claims, 11 Drawing Sheets

(56) References Cited

U.S. PATENT DOCUMENTS

| | | | |
|---|---|---|---|
| 10,278,305 B2* | 4/2019 | Roan | H05K 7/20254 |
| 2003/0010477 A1 | 1/2003 | Khrustalev et al. | |
| 2007/0227703 A1* | 10/2007 | Bhatti | F28D 15/02 |
| | | | 165/104.33 |
| 2008/0236790 A1 | 10/2008 | Bhatti et al. | |
| 2016/0091257 A1* | 3/2016 | Minx | F28D 15/02 |
| | | | 165/104.21 |
| 2016/0123637 A1* | 5/2016 | Moreno | F25B 39/02 |
| | | | 62/516 |
| 2017/0055377 A1 | 2/2017 | Rice et al. | |
| 2018/0279508 A1 | 9/2018 | Roan et al. | |

OTHER PUBLICATIONS

Extended European Search Report dated Jul. 26, 2021 issued in corresponding European Patent Application No. 21153933.3-1002.

* cited by examiner

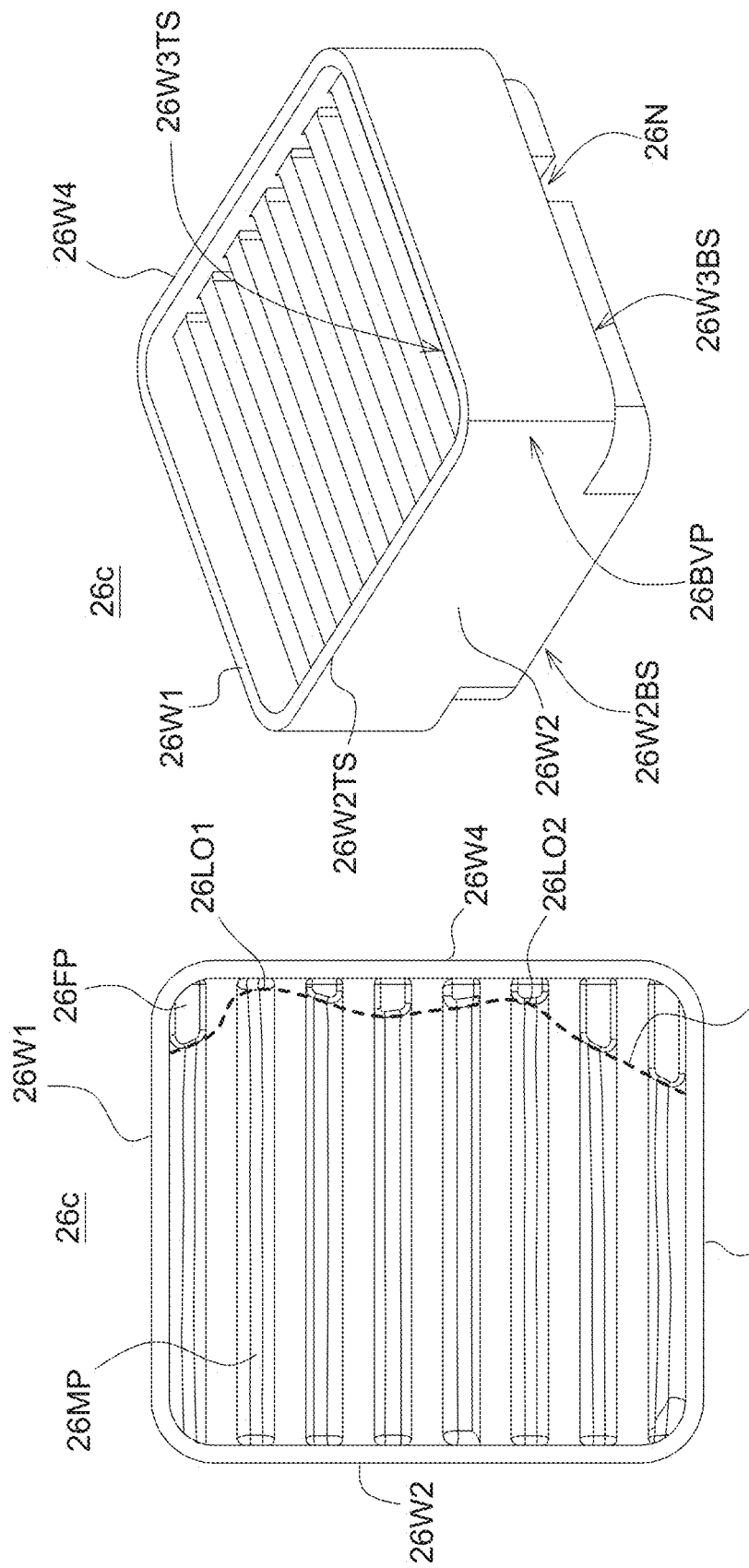

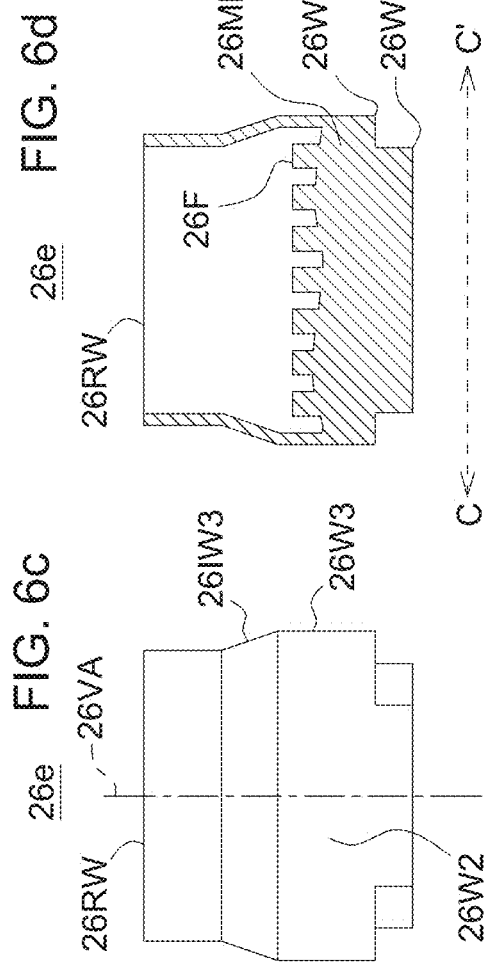
FIG. 6b
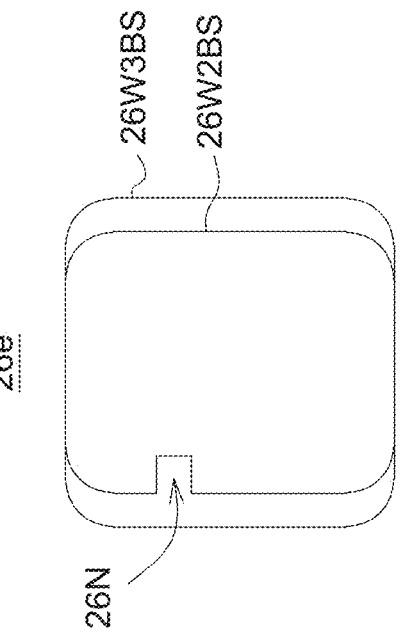
FIG. 6c
FIG. 6d
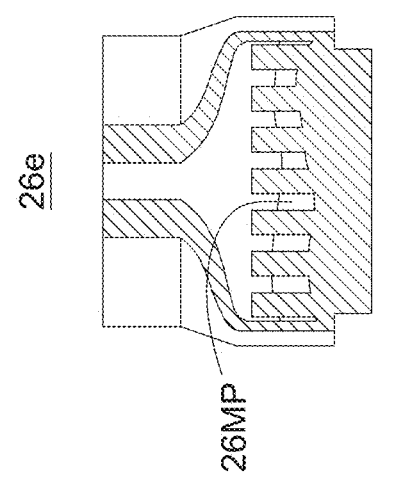
FIG. 6e
FIG. 6f
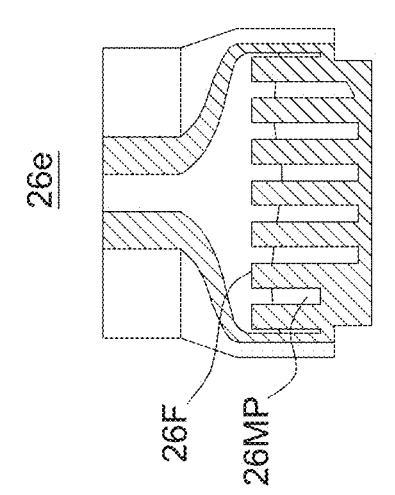
FIG. 6g

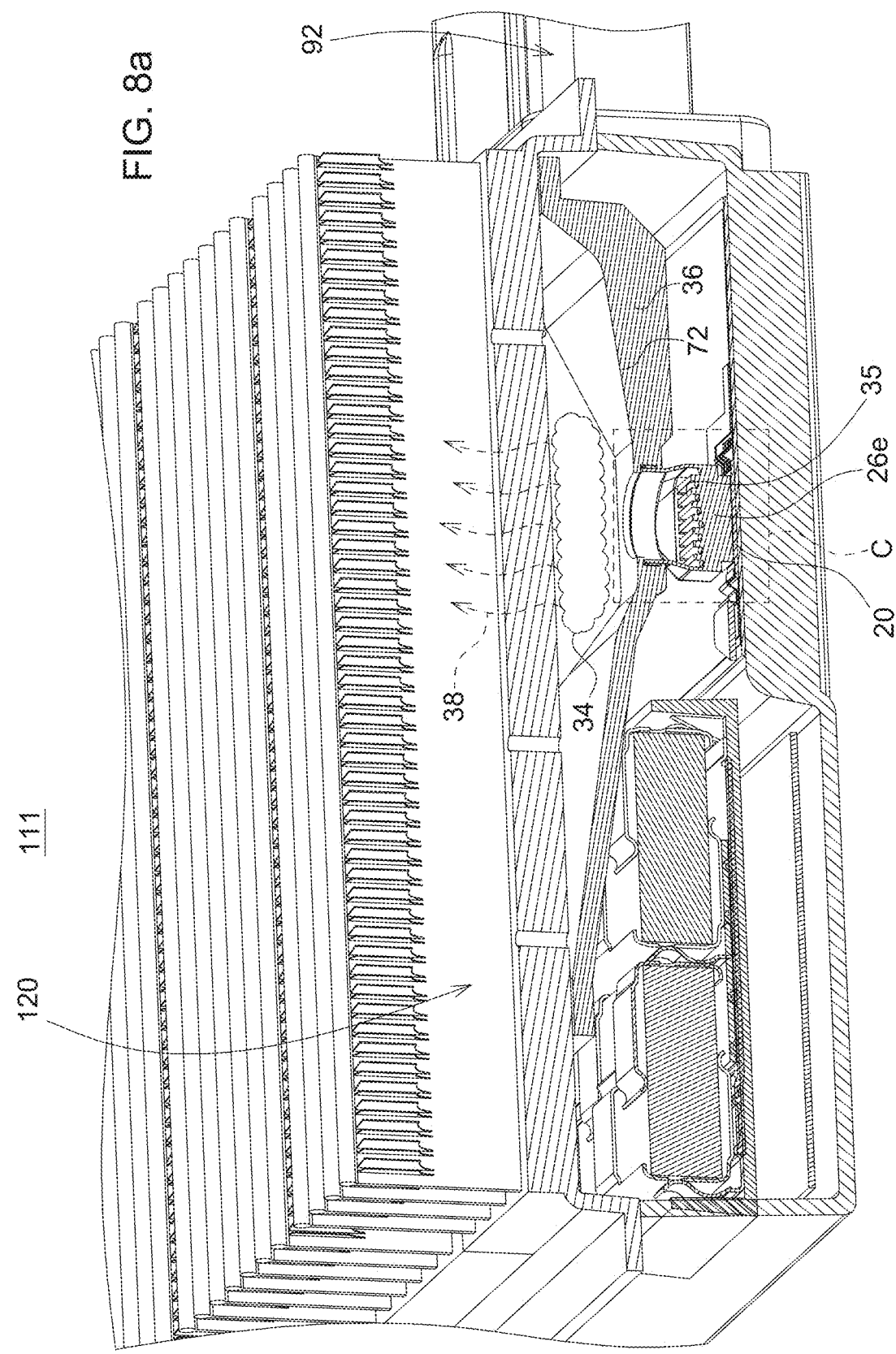

EVAPORATOR STACKS AND ELECTRONIC ASSEMBLIES

CROSS-REFERENCE TO RELATED APPLICATIONS

This application is a continuation-in-part of, and claims priority under 35 U.S.C. § 120 to, U.S. application Ser. No. 16/870,320 filed in the United States Patent & Trademark Office on May 8, 2020 and claims priority under 35 U.S.C. § 119(e) to U.S. Provisional Application No. 63/009,789 filed in the United States Patent & Trademark Office on Apr. 14, 2020, the entire contents of each of which are herein incorporated by reference.

GOVERNMENT LICENSE RIGHTS

This invention was made under CRADA 15-592 between John Deere Electronic Solutions and the National Renewable Energy Laboratory operated for the United States Department of Energy by Alliance for Sustainable Energy, LLC under Prime Contract No. DE-AC36-08G028308. This invention was made with government support under Prime Contract No. DE-AC36-08G028308 (CRADA 15-592) awarded by United States Department of Energy by Alliance for Sustainable Energy, LLC. The Government has certain rights in this invention.

BACKGROUND

Example embodiments relate, in general, to evaporator stacks for use in electronic assemblies.

In a power electronics system, heat generating components may include power semiconductor devices such as silicon insulated-gate bipolar transistors (IGBTs) or silicon carbide (SiC) metal-oxide-semiconductor field effect transistors (MOSFETs). The thermal design of power electronic systems regulates a junction temperature of the power semiconductor device to achieve a desired longevity and/or reliability. There may generally be two alternate cooling approaches: (1) air-cooled configurations and (2) liquid-cooled configurations.

SUMMARY

Because of high heat-flux generated by power semiconductor devices, liquid cooling is often used in an electronics system (e.g., an inverter) for heavy-duty vehicles. However, liquid-cooled configurations may be costly and complex due to an external pump and radiator systems to extract heat from liquid flowing through coolant channels in the electronics system.

The inventors have discovered an electronic assembly with phase-change cooling of a semiconductor device having an evaporator stack capable of improving the cooling.

Some example embodiments include evaporator stacks having features that may minimize or reduce a maximal heat flux.

Some example embodiments include evaporator stacks that enable passive, e.g. pumpless, two-phase heat transfer for power-dense power electronics.

Example embodiments include evaporators that may remove heat, e.g. heat produced by a semiconductor device, and may transfer the heat produced by the semiconductor device to heat transfer fluids, such as air, liquid, and/or other media.

According to some example embodiments, there is provided an evaporator stack including a lower floor including at least one mounded portion, and an enclosure surrounding the lower floor, wherein a height of the enclosure is greater than a height of the at least one mounded portion, the at least one mounded portion extending between two walls of the enclosure.

BRIEF DESCRIPTION OF DRAWINGS

Example embodiments will be more clearly understood from the following detailed description taken in conjunction with the accompanying drawings. FIGS. 1-7 represent non-limiting, example embodiments as described herein.

FIG. 1 is a perspective view of an electronic assembly, according to some example embodiments.

FIG. 2 is a perspective view of an evaporator stack, according to some example embodiments.

FIG. 4a is a top-down view of an evaporator stack, according to some example embodiments.

FIG. 4b is a perspective view of an evaporator stack, according to some example embodiments.

FIG. 6b is a top-down view of the evaporator stack of FIG. 6a.

FIG. 6c is a profile view of the evaporator stack of FIG. 6a.

FIG. 6d is a cross-sectional view of the evaporator stack of FIG. 6a, taken along line C-C' of FIG. 6b.

FIG. 6e is a cross-sectional view of the evaporator stack of FIG. 6a, taken along line D-D' of FIG. 6b.

FIG. 6f is a cross-sectional view of the evaporator stack of FIG. 6a, taken along line E-E' of FIG. 6b.

FIG. 6g is a bottom view of the evaporator stack of FIG. 6a.

FIG. 7 is a perspective view of an electronic assembly, according to some example embodiments.

FIG. 8a is a cut-away view of an electronic assembly, according to some example embodiments.

FIG. 8b is a zoom-in of the section labeled "C" in FIG. 8a.

DETAILED DESCRIPTION OF EXAMPLE EMBODIMENTS

Figure 1:
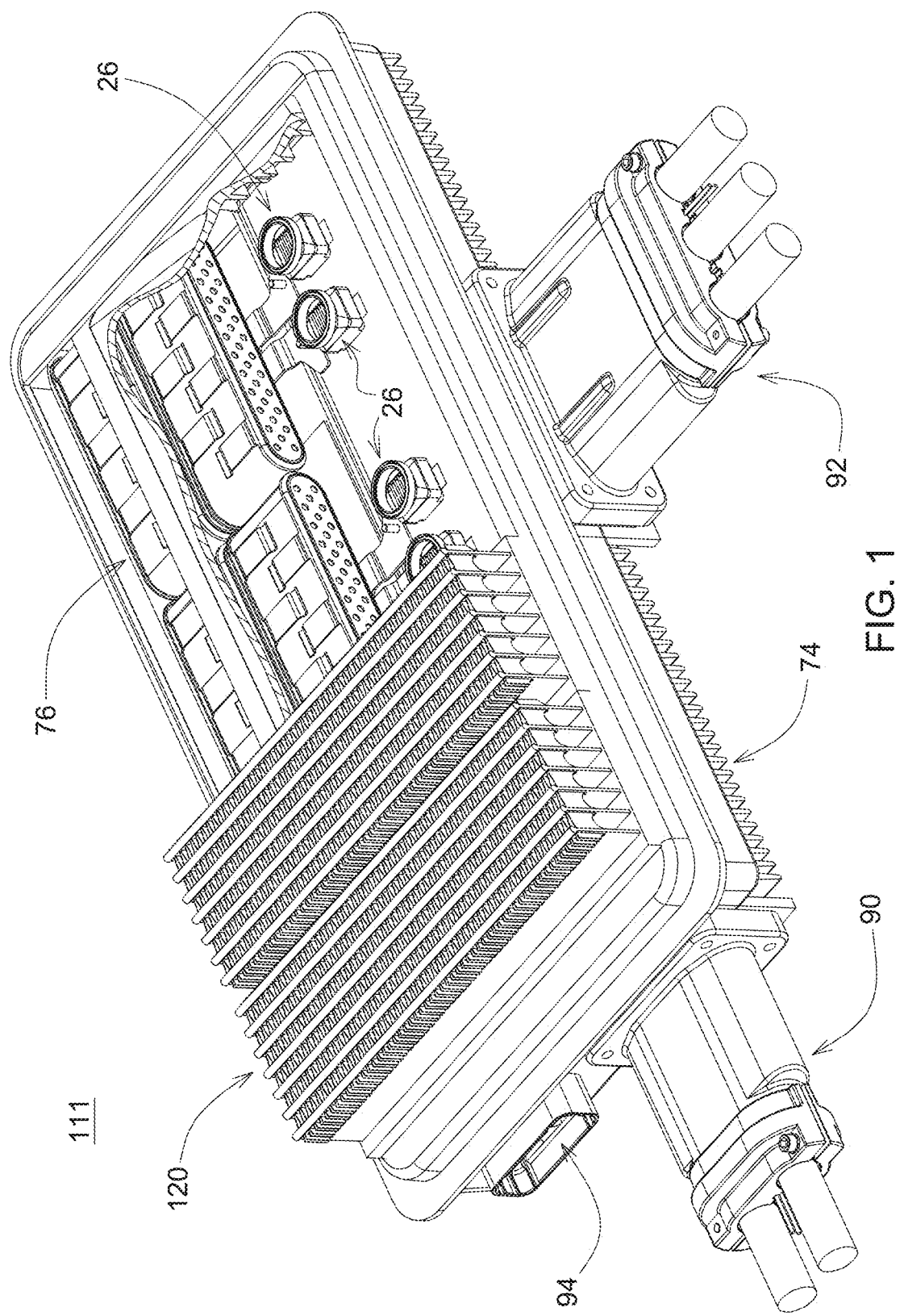

Some example embodiments will now be described more fully with reference to the accompanying drawings in which some example embodiments are illustrated.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Example embodiments include evaporator stacks for use in electronic assemblies, such as those described in U.S. Pat. No. 10,278,305, the entire contents of which are herein incorporated by reference.

In a power electronics system, heat generating components include power semiconductor modules, such as silicon insulated gate bipolar transistors (IGBTs) and/or silicon carbide (SiC) MOSFETs, and/or gallium nitride (Ga) power semiconductor devices. A regulated junction temperature of the power semiconductor modules may be beneficial to achieve desired lifetime and/or reliability goals, particularly in high-power-density inverters used for applications such as, but not limited to be, off-highway heavy-duty vehicles. Due to high heat-flux generated by power semiconductor modules in these applications, liquid cooling may be used in the inverters, for example for inverters for heavy-duty vehicles.

Inverter systems may be liquid cooled using a coolant/refrigerant such as water-ethylene-glycol solutions, e.g. antifreeze. Such cooling may enable efficient operation of high-powered inverter systems. Liquid cooling may use an external pump and/or radiator systems to extract heat from liquid flowing through coolant channels in a power inverter.

According to some example embodiments, liquid cooling may be enabled with a passive, pumpless air cooling, that may achieve high heat transfer from heat generated during operation of a semiconductor device. For example, coolant/refrigerant on a surface of the semiconductor device may vaporize and change the phase of the refrigerant/coolant (e.g. an antifreeze), which may then rise, e.g. rise via thermal convection, to within a condenser. Within the condenser, heat may be dissipated in air, e.g. by a fan. The condenser may cause condensation of the coolant. Upon condensation of the vapor, the coolant/refrigerant changes phase back to liquid, and collects again to be evaporated by the evaporator.

Accordingly, solutions using a two-phase cooling media using environment friendly refrigerant (for example, R-245fa and HFO-1233zd) may be utilized. However, example embodiments are not limited thereto. The two phases may be or correspond to gas-phase and liquid-phase.

Example embodiments may be applicable for planar power devices but can be extended to cover other devices, such as planar interconnects within an inverter. Example embodiments may enable two-phase passive cooling, and may not require any pumping method for coolant indirectly contacting the planar power semiconductor chipsets.

If a heat flux at a cooled surface is too high, the surface will be covered by a vapor film that may prevent liquid from returning to the surface. This heat flux condition may cause the cooling performance to degrade.

According to example embodiments, an evaporator stack may operate below a thermal limit where a phase change occurs, such as below the critical heat flux value.

According to some example embodiments, there is provided an evaporator stack comprising a lower floor including at least one mounded portion, and an enclosure surrounding the lower floor and connected to the at least one mounded portion. A height of the enclosure is greater than a height of the at least one mounded portion.

According to some example embodiments, the enclosure comprises a first vertical wall, a second vertical wall, a third vertical wall facing the first vertical wall, and a fourth vertical wall facing the second vertical wall.

According to some example embodiments, the first vertical wall intersects the second vertical wall, the second vertical wall intersects the third vertical wall, and the fourth vertical wall intersects the first vertical wall.

According to some example embodiments, the lower floor includes a plurality of flat portions, the second vertical wall is adjacent to a first flat portion of the plurality of flat portions, and the fourth vertical wall is adjacent to a second flat portion of the plurality of flat portions.

According to some example embodiments, the lower floor includes at least one flat portion, and an edge between at least one of the at least one flat portion and at least one of the at least one mounded portion is curved.

According to some example embodiments, the enclosure and the lower floor are integrally formed.

According to some example embodiments, the enclosure includes a metallic material, the metallic material including copper, aluminum, gold, alloys thereof, a sub-combination thereof, or a combination thereof.

According to some example embodiments, the evaporator stack comprises a microporous layer including a powdered carbon in a matrix, the microporous layer on surfaces of the metallic material.

According to some example embodiments, the enclosure includes a first vertical wall, a second vertical wall, a third vertical wall facing the first vertical wall, and fourth vertical wall facing the second vertical wall. The evaporator stack further comprises a first inclined wall on the first vertical wall, a second inclined wall on the second vertical wall, a third inclined wall on the third vertical wall, and a fourth inclined wall on the fourth vertical wall. The first inclined wall and the third inclined wall are inclined in a direction towards each other, and the second inclined wall and the fourth inclined wall are inclined in a direction towards each other.

According to some example embodiments, the evaporator stack comprises a ringed wall on the first inclined wall, the ringed wall having a substantially cylindrical shape.

According to some example embodiments, the evaporator stack comprises a first inclined beveled portion between the first inclined wall and the second inclined wall.

According to some example embodiments, the first vertical wall, the second vertical wall, the third vertical wall, and the fourth vertical wall are not inclined with respect to each other.

According to some example embodiments, a length of the first vertical wall is based on a dimension of a semiconductor device.

According to some example embodiments, the evaporator stack comprises a first beveled vertical portion between the first vertical wall and the second vertical wall.

According to some example embodiments, a top surface of the first vertical wall is planar with a top surface of the second vertical wall, and a bottom surface of the first vertical wall is lower than a bottom surface of the second vertical wall.

According to some example embodiments, there is provided an evaporator stack comprising a lower floor, an enclosure surrounding the lower floor, and a plurality of linear fins extending horizontally on the lower floor.

According to some example embodiments, the plurality of linear fins extend parallel to one another.

According to some example embodiments, the lower floor comprises at least one flat portion and at least one mounded portion, a height of at least one of the plurality of linear fins is greater than a height of the at least one mounded portion, and the height of the at least one of the plurality of linear fins is less than a height of the enclosure.

According to some example embodiments, there is provided an electronic assembly comprising at least one semiconductor device including at least one of a silicon power semiconductor chip, a silicon carbide power semiconductor chip, or a gallium nitride power semiconductor chip, and an evaporator stack on the at least one semiconductor device. The evaporator stack comprises a lower floor including at least one mounded portion, and an enclosure surrounding the lower floor. A height of the enclosure is greater than a height of the at least one mounded portion.

According to some example embodiments, the electronic assembly further comprises interconnects connecting the at least one semiconductor device to at least one of a DC bus capacitor or DC and AC ports.

FIG. 1 illustrates a partially cut-out perspective view of an electronic assembly, according to some example embodiments.

Referring to FIG. 1, an electronic assembly 111 may include at least one capacitor 76, at least one condenser 120, at least one control port 94, at least one DC port 90, at least one AC port 92, a plurality of external fins 74, and at least one evaporator stack 26.

The DC port 90 can be connected to a direct current supply of electrical energy. The AC port 92 outputs one or more alternating current output signals, such as the output phase signals of a controller and/or an inverter. The current that is output may be used to drive a motor; however, example embodiments are not limited thereto. The current that is output may be three-phase AC current; however, example embodiments are not limited thereto. The control port 94 may be coupled to a data bus, cable or other transmission line for communication of input and output digital signals, analog signals, or both.

For example, the DC port 90 may be connected to a generator (not shown), and may receive a DC current generated by the generator. The electronic assembly 111 may invert the DC current to an AC current. The AC current may be supplied to a motor (not shown) that is connected to the AC port 92.

The condenser 120 condenses a coolant/refrigerant used in cooling the semiconductor device, as described below in more detail. The external fins 74 support air cooling of the condenser 120.

Evaporator stacks 26 may be affixed on top of semiconductor devices, to be described below in more detail. There may be one evaporator stack 26 on top of one semiconductor device. In other words, there may be a one to one correspondence between evaporator stacks and semiconductor devices.

An evaporator stack 26 may also be described as an evaporator receptacle, an evaporator container, or other similar terms.

Evaporator stacks 26 illustrated in FIG. 1 may correspond to the same, or different, evaporator stacks 26a-27e illustrated below in FIGS. 2-6.

Figure 2:
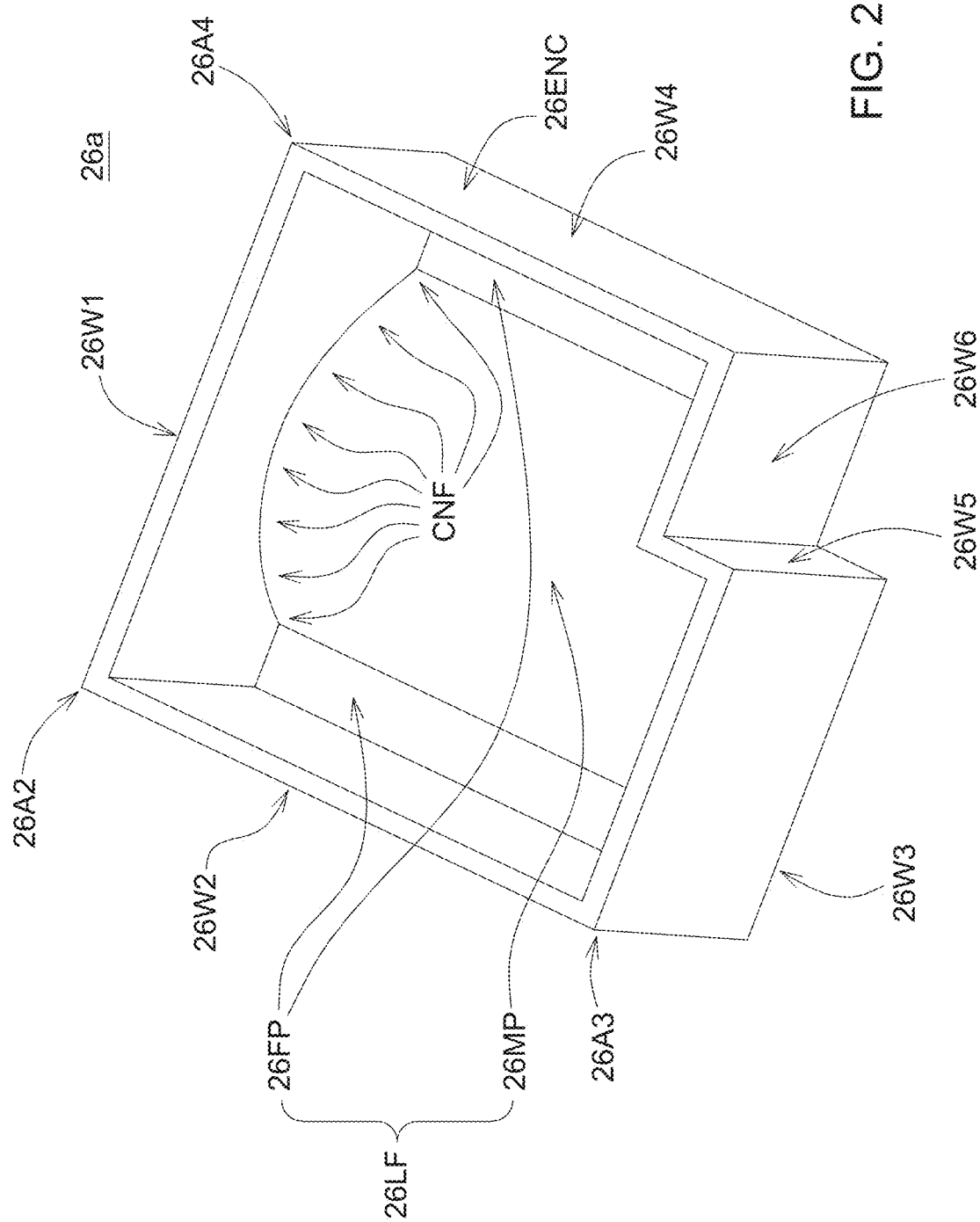

FIG. 2 illustrates a perspective view of an evaporator stack 26a, according to some example embodiments.

Referring to FIG. 2, the evaporator stack 26a may include an enclosure 26ENC having a plurality of walls including a first vertical wall 26W1, a second vertical wall 26W2, a third vertical wall 26W3, a fourth vertical wall 26W4, a fifth vertical wall 26W5, and a sixth vertical wall 26W6.

The evaporator stack 26a may also include a lower floor 26LF. The lower floor 26LF may include a flat portion 26FP, and a mounded portion 26MP. The lower floor 26LF may be in thermal communication with a semiconductor device, such as semiconductor device 20 described below with reference to FIG. 7.

Each of the first through sixth vertical walls 26W1 to 26W6 may be vertical, and may be normal/perpendicular to a surface of the lower floor 26LF. However, example embodiments are not limited thereto, and at least one of the first through sixth vertical walls 26W1 to 26W6 may be at a non-perpendicular angle with respect to a surface of the lower floor 26LF.

In some example embodiments, each of the first through sixth vertical walls 26W1 to 26W6 is joined to another wall at a normal angle.

The first vertical wall 26W1 may face the third vertical wall 26W3. For example, the first vertical wall 26W1 and the third vertical wall 26W3 may be parallel to one another; however, example embodiments are not limited thereto. The second vertical wall 26W2 may face the fourth vertical wall 26W4. For example, the second vertical wall 26W2 may be parallel to the fourth vertical wall 26W4; however, example embodiments are not limited thereto.

Furthermore, as illustrated in FIG. 2, the fifth vertical wall 26W5 may face the second vertical wall 26W2 and vertical walls 26W2 and 26W5 may be parallel, and the sixth vertical wall 26W6 may face the first vertical wall 26W1 and vertical walls 26W6 and 26W1 may be parallel; however, example embodiments are not limited thereto.

In some example embodiments, the dimensions of the first vertical wall 26W1 and the second vertical wall 26W2 may be the same. For example, a length of the first vertical wall 26W1 may be about 15-30 mm, e.g. may be about 24 mm. Similarly a length of the second vertical wall 26W2 may be about 15-30 mm, e.g. may be about 24 mm.

In some example embodiments, a height of each of the vertical walls 26W1 to 26W4 may be about 7-12 mm, e.g. about 9.8 mm. In some example embodiments, a thickness of each of the vertical walls 26W1 to 26W4 may be about 1 mm; however, example embodiments are not limited thereto. Dimensions of the evaporator stack 26a may vary, and dimensions may be based on dimensions of the semiconductor device.

The first vertical wall 26W1 may intersect with the second vertical wall 26W2 at a second angle 26A2. The second angle 26A2 may be a right angle; however, example embodiments are not limited thereto. Similarly, the second vertical 26W2 may intersect the third vertical wall 26W3 at a third angle 26A3, and the first vertical wall may intersect the fourth vertical wall at a fourth angle 26A4. Each of the second through fourth angles 26A2-26A4 may be right angles (ninety degrees); however, example embodiments are not limited thereto.

In other example embodiments, the enclosure 26ENC may include more or less than six vertical walls. For example, the enclosure 26ENC may include vertical walls to form a polygonal enclosure, and may include a plurality of concave and convex angles. A shape of the polygonal enclosure 26ENC may be associated with the specific semiconductor device. Alternatively, in other example embodiments, the enclosure 26ENC may be round. For example, the enclosure 26ENC may have one continuous wall. For example, the enclosure 26ENC may be circular, or oval/elliptical, or asymmetric. However, example embodiments are not limited thereto and the enclosure 26ENC may be a shape other than circular, oval/elliptical, asymmetric or rectangular.

The lower floor 26LF may include the flat portion 26FP and the mounded portion 26MP. The flat portion 26FP may be substantially flat. The flat portion 26FP may include a first portion on one side of the mounded portion 26MP and a second portion on another side of the mounded portion 26MP. The lower floor 26LF including the flat portion 26FP and the mounded portion 26MP may be solid, e.g. may be made of one contiguous material.

However, example embodiments are not limited thereto. For example, the lower floor 26LF may not include a flat portion 26FP, but may include the mounded portion 26MP. The mounded portion 26MP may abut all surfaces of the enclosure 26ENC.

The mounded portion 26MP may include a mound. A longitudinal axis of the mounded portion 26MP may extend in a direction from first vertical wall 26W1 to the third vertical wall 26W3. Moreover, at least a portion of the mounded portion 26MP may extend from the first vertical wall 26W1 to the third vertical wall 26W3; however, example embodiments are not limited thereto.

The mounded portion 26MP may have a cross-sectional shape of an upside-down "U". A cross-sectional curvature of the mounded portion 26MP may have a radius of curvature of about 5 mm; however, example embodiments are not limited thereto. The curvature of the mounded portion 26MP may be constant or substantially constant throughout the extent of the mounded portion 26MP; however, example embodiments are not limited thereto. The mounded portion 26MP may have a saddle shape, or, alternatively, may not have a saddle shape. The mounded portion 26MP may not include a saddle point, may include a single saddle point, or may include a plurality of saddle points. A shape of the mounded portion 26MP may be irregular, and may not have any symmetry.

The mounded portion 26MP may extend from one vertical wall of the enclosure 26ENC to another vertical wall of the enclosure 26ENC. Although FIG. 2 illustrates that the flat portion 26FP intersects the second vertical wall 26W2 and the fourth vertical wall 26W4, example embodiments are not limited thereto. Furthermore, although FIG. 2 illustrates the mounded portion 26MP intersects the first vertical wall 26W1 and the third vertical wall, example embodiments are not limited thereto.

According to some example embodiments, the evaporator stack 26a including the mounded portion 26MP may disperse the heat distribution more evenly, and less heat may be localized within the evaporator stack 26a. There may be less heat dissipation extending directly upwards, for example as compared with an evaporator stack without a mounded portion, and/or with only a flat surface. For example, the mounded portion 26MP may enable heat dissipation in a direction CNF that is initially conformal to the shape of the mounded portion 26MP. The evaporator stack 26a may efficiently evaporate a refrigerant/coolant, and may have less localized areas of heating than an evaporator stack without a mounded portion.

Figure 3B:
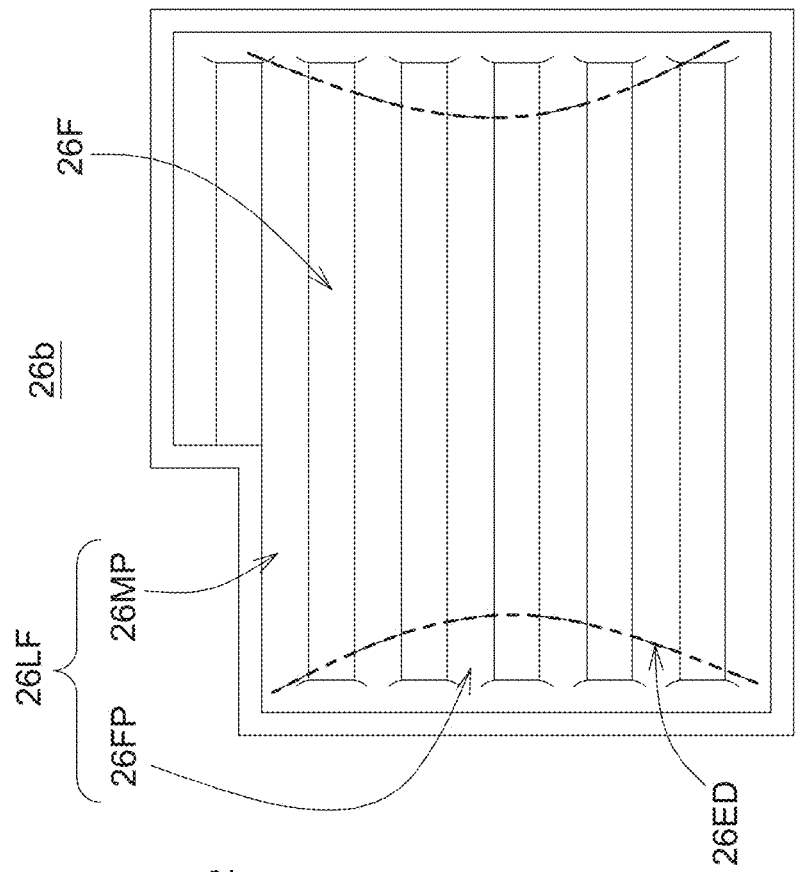
FIG. 3b is a top-down view of an evaporator stack, according to some example embodiments.
Figure 3A:
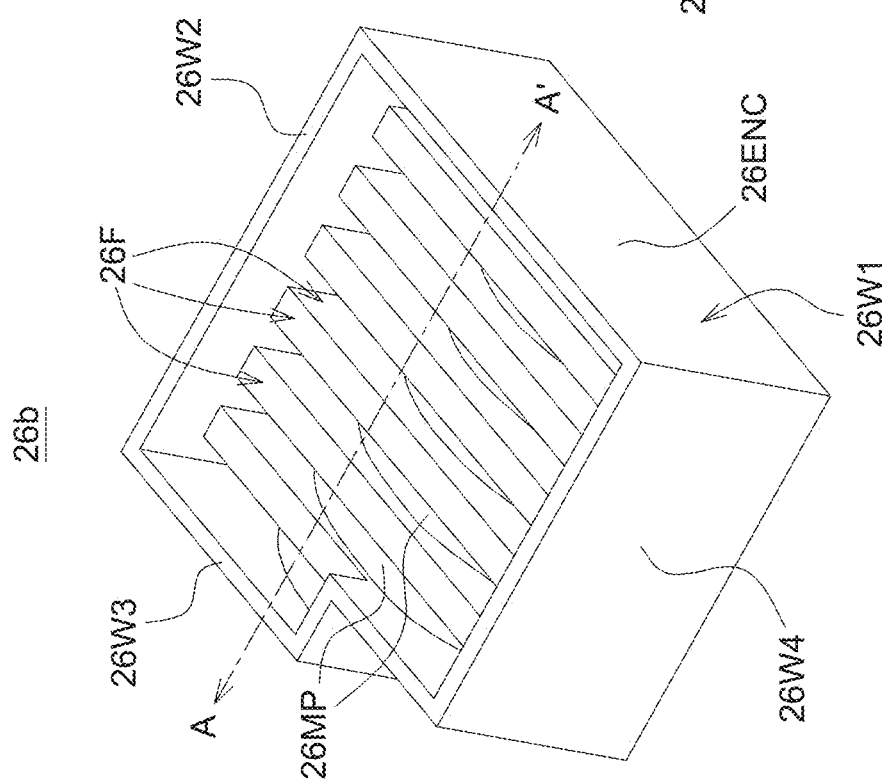
FIG. 3a is a perspective view of an evaporator stack, according to some example embodiments.
Figure 3C:
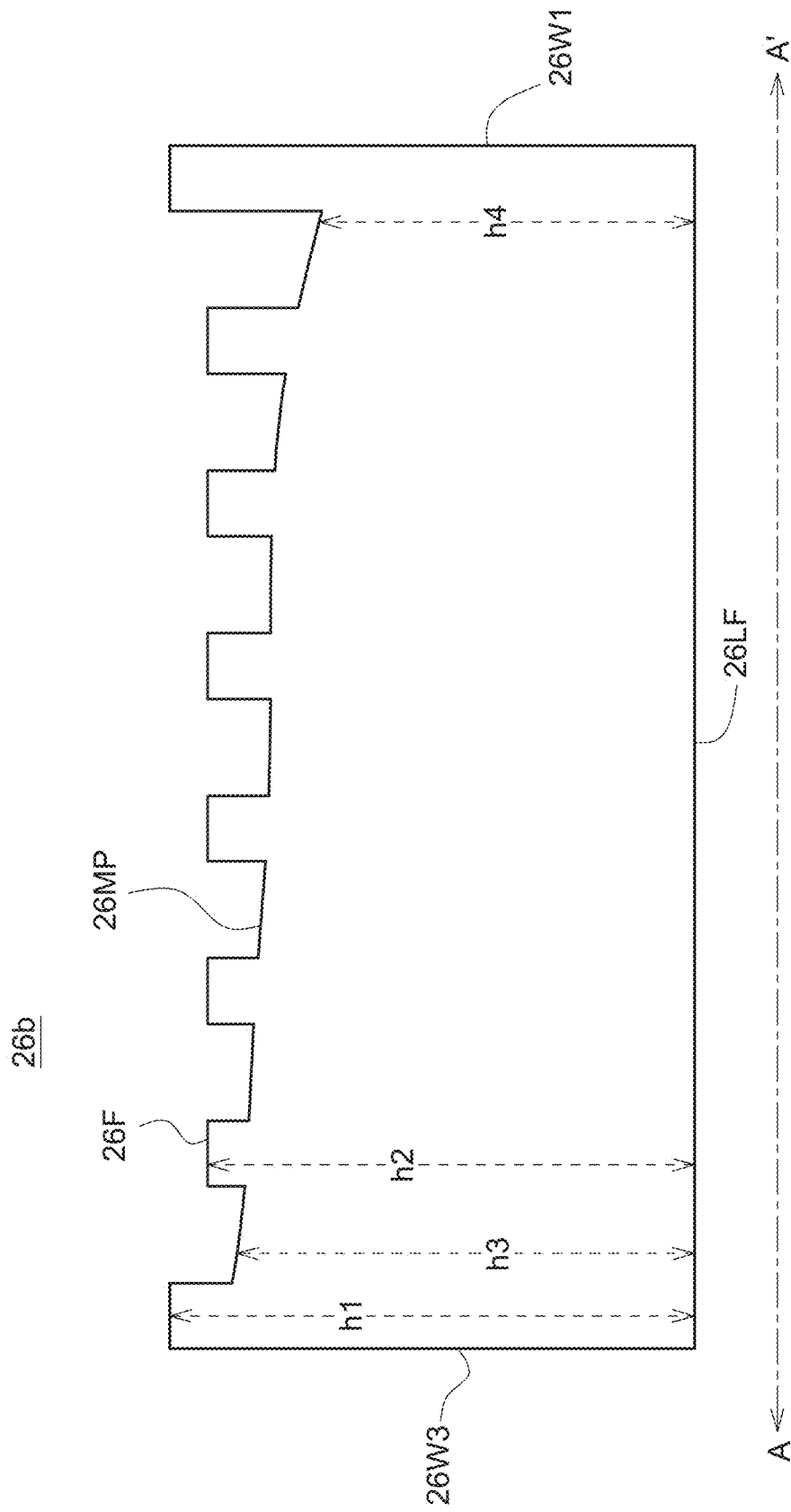
FIG. 3c is a cross-section view of the evaporator stack of FIG. 3a, taken along line A-A'.

FIG. 3a illustrates a perspective view of an evaporator stack 26b, FIG. 3b illustrates a top-down plan view of the evaporator stack 26b of FIG. 3a, and FIG. 3c illustrates a cross-sectional view of the evaporator stack 26b of FIG. 3a, taken along line A-A'

Referring to FIG. 3a, the evaporator stack 26b may include a plurality of fins 26F. Each of, or at least some of, the plurality of fins 26F may be linear fins, e.g. may extend linearly, e.g. extend linearly in a horizontal direction relative to the lower floor 26LF. For example, as illustrated in FIG. 3a, the fins 26F may extend linearly in a direction from the second vertical wall 26W2 to the fourth vertical wall 26W4. Each of the fins 26F may be parallel to one another; however, example embodiments are not limited thereto.

A number of the fins 26F included in the evaporator stack 26b may be any number such as three, four, five, six, seven, eight, nine, ten, eleven, twelve, or thirteen. As a number of fins 26F increases, a surface area of the evaporator stack 26b increases, which may improve heat transfer. As a number of fins 26F decreases, fabrication of the evaporator stack 26b may be more efficient.

The fins 26F may be arranged at a constant pitch; however, example embodiments are not limited thereto.

Referring to FIG. 3b, the mounded portion 26MP and the flat portion 26FP may meet at an edge 26ED. The edge 26ED between the mounded portion 26MP and the flat portion 26FP may be curved. For example, as illustrated in FIG. 3b, the edge between the mounded portion 26MP and the flat portion FP may be curved in a concave manner, e.g. concave with respect to the mounded portion. The edge 26ED may be symmetric. The mounded portion 26MP may be or correspond to one continuous piece of the evaporator 26b.

Referring to FIG. 3c, heights of the vertical walls, e.g. a height h1 of the third vertical wall 26W3 as measured from a bottom surface of the lower floor 26LF to a top surface of the third vertical wall 26W3, may be greater than a height h2 of each of, or at least one of, the fins 26F. Additionally, the height h1, or both the height h1 and the height h2, may be greater than a greatest height h3 of the mounded portion 26MP.

The heights h2 of each of the fins 26F may be the same, or may not be the same, and example embodiments are not limited thereto. For example, one of the fins 26F may have a height h2 greater than another of the fins 26F.

Furthermore, as illustrated in FIG. 3c, the greatest height h3 of the mounded portion 26MP may be greater than a lowest height h4 of the mounded portion 26MP, but less than the height h2.

Although FIG. 3c illustrates that a height of the mounded portion 26MP varies monotonically, example embodiments are not limited thereto. For example, a lowest height of a mounded portion may be in a middle between the third vertical wall 26W3 and the first vertical wall 26W1.

Alternatively, a height of the mounded portion may be constant, that is, may not vary from the third vertical wall 26W3 to the first vertical wall 26W1.

Furthermore, although FIG. 3c illustrates a particular variation of heights of the mounded portion 26MP, example embodiments are not intended to be limited to the particular heights disclosed in FIG. 3c.

FIG. 4a illustrates a plan view of an evaporator stack 26c looking top-down on the evaporator stack 26c, and FIG. 4b illustrates a perspective view of the evaporator stack 26c.

As illustrated in FIGS. 4a and 4b, walls such as the first vertical wall 26W1 and the second vertical wall 26W2 may not intersect at sharp right angles. For example, there may be a beveled vertical portion 26BVP between the intersections of vertical walls such as second vertical wall 26W2 and third vertical wall 26W3. The beveled vertical portion 26BVP is illustrated as being rounded; however, example embodiments are not limited thereto. For example, the beveled vertical portion 26BVP may include sharp angles. Furthermore, as illustrated in FIGS. 4a and 4b, there may be only four vertical walls 26W1-26W4. Additionally, the edge 26ED between the flat portion 26FP and the mounded portion 26MP may have an irregular, or asymmetric, shape. Furthermore, the edge 26ED may curve in a curvilinear manner that has a plurality of local optima, such as local optima 26LO1 and local optima 26LO2. The edge 26ED may have both concave and convex segments.

Still further as illustrated in FIG. 4b, a top surface 26W2TS of the second vertical wall 26W2 may be planar with, e.g. flush with, a top surface 26W3TS of the third vertical wall 26W3; however, a bottom surface 26W2BS of the second vertical wall 26W2 may not be planar with, e.g. may not be flush with, a bottom surface 26W3BS of the third vertical wall 26W3. For example, the bottom surface 26W2BS of the second vertical wall 26W2 may extend further than the bottom surface 26W3BS of the third vertical wall 26W3.

Still referring to FIG. 4b, there may be a notch 26N defined by the bottom surfaces of the second vertical wall 26W2 and the fourth vertical wall 26W4. The notch 26N may allow for access to gate connections on the semiconductor chip. Such gate connections may be used to turn the semiconductor chip on or off. Shapes and/or dimensions of the notch 26N may be adjusted to accommodate the specific semiconductor chip above which the evaporator stack 26c may be and/or to which the evaporator stack 26c may contact/directly contact.

Figures 5A, 5B:
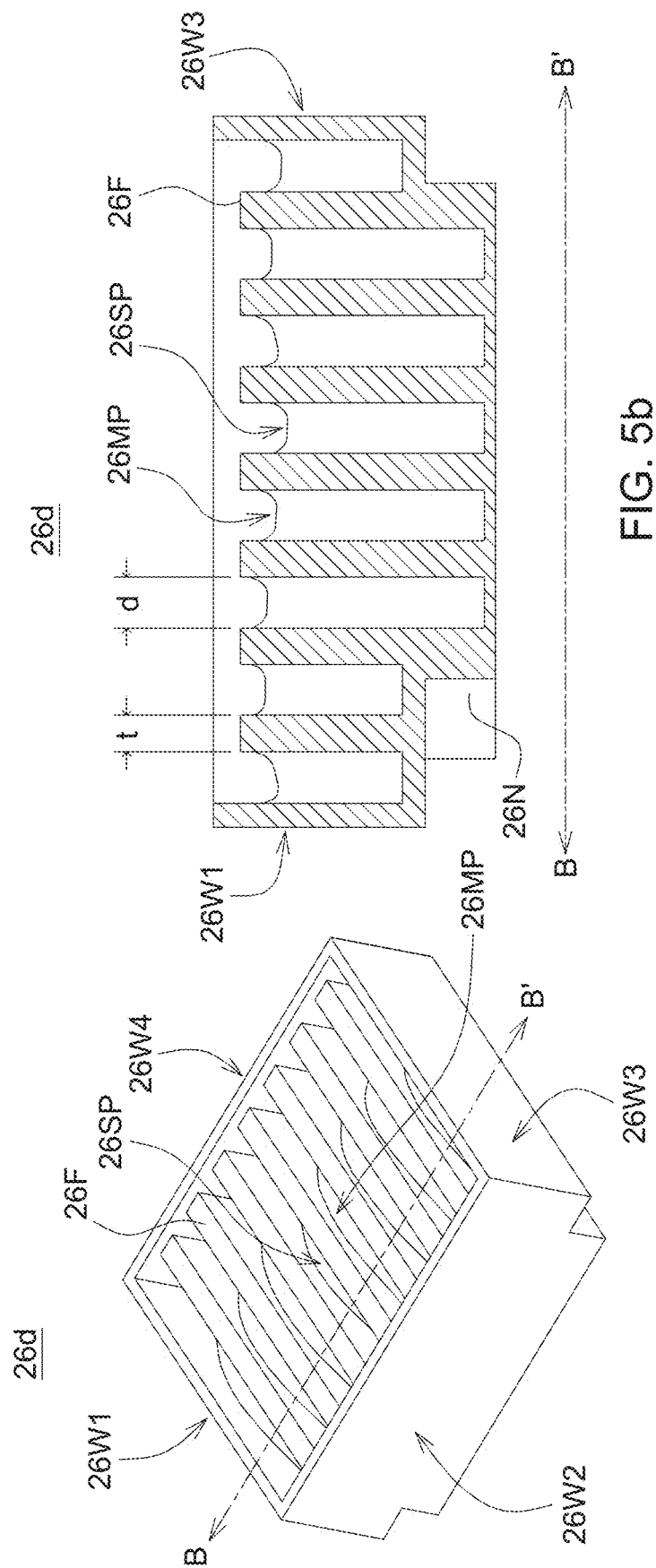
FIG. 5a is a perspective view of an evaporator stack, according to some example embodiments.
FIG. 5b is a cross-sectional view of the evaporator stack of FIG. 5a, taking along line B-B'.

FIG. 5a is a perspective view of an evaporator stack 26d, and FIG. 5b is a cross-sectional view of FIG. 5a along the line B-B', that is, just inside of the second vertical wall 26W2.

Referring to FIGS. 5a and 5b, the evaporator stack 26d may include a plurality of vertical walls 26W1-26W4, a plurality of fins 26F, and a mounded portion 26MP.

A thickness t of at least one of the fins 26F of the evaporator stacks 26b, 26c, 26d, and 26e may be about 1.5 mm. In some example embodiments, a distance d between separate fins 26F of the evaporator stacks 26b, 26c, 26d, and 26e may be about 1.8 mm.

Furthermore, the mounded portion 26MP may include at least one saddle point, such as saddle point 26MP. The saddle point 26MP may correspond to a local minimum of a height of the mounded portion 26MP along the direction from the first wall 26W1 to the third wall 26W3. Furthermore the saddle point 26MP may correspond to a local maximum of a height of the mounded portion 26MP along the direction from the second wall 26W2 to the fourth wall 26W4.

Figure 6A:
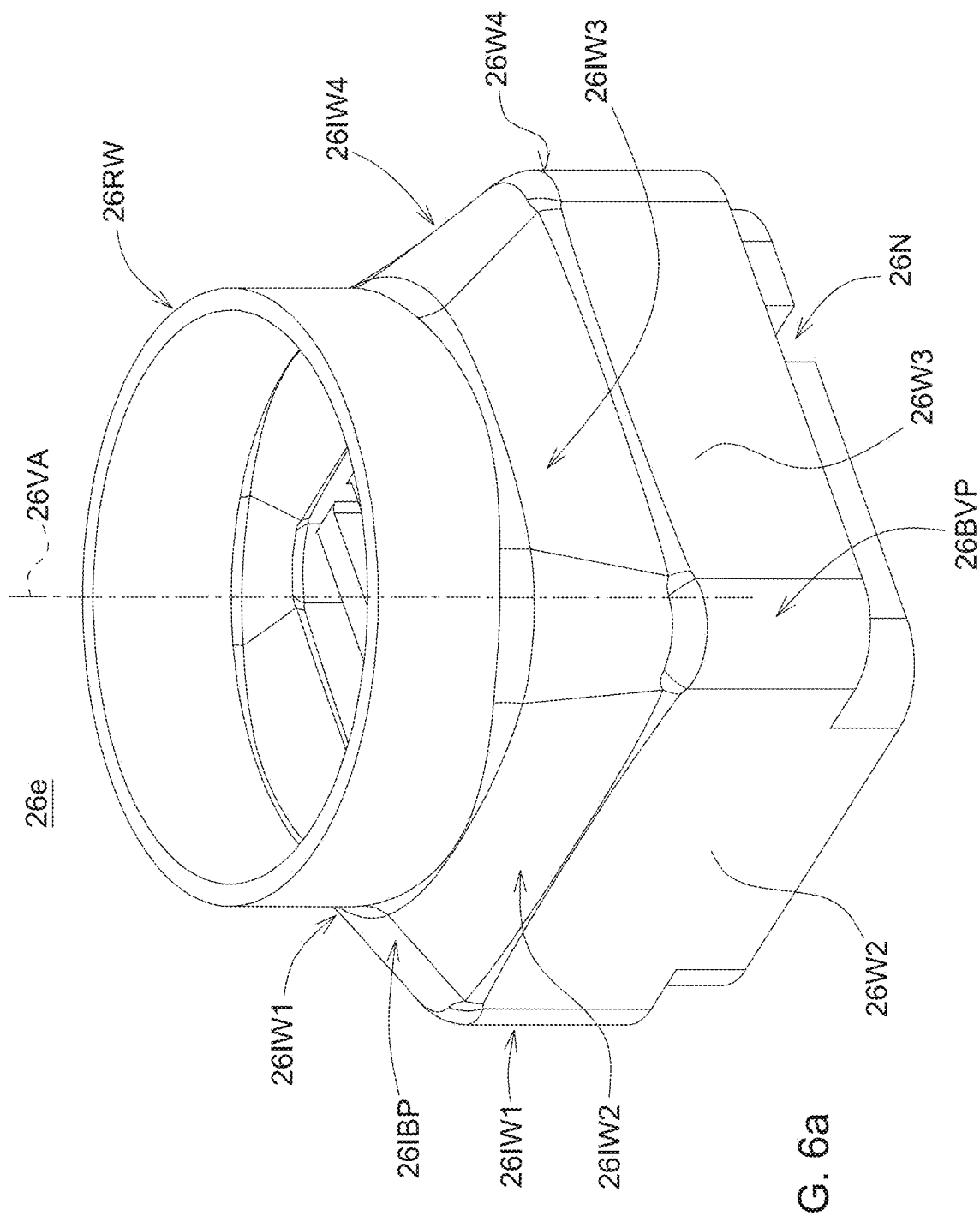
FIG. 6a is a perspective view of an evaporator stack, according to some example embodiments.

FIG. 6a illustrates a perspective view of an evaporator stack 26e according to some example embodiments. FIG. 6b illustrates a top-down view of the evaporator stack 26e. FIG. 6c illustrates a side view of the evaporator stack 26e. FIG. 6d illustrates a cross-sectional view of the evaporator stack 26e, taken along cross-section line C-C'. FIG. 6e illustrates a cross-sectional view of the evaporator stack 26e, taken along cross-section line D-D'. FIG. 6f illustrates a cross-section view of the evaporator stack 26e, taken along cross-section line E-E'. FIG. 6g illustrates a bottom-view of the evaporator stack 26e.

FIGS. 6a-6g may include features similar to those of FIGS. 2-5b, and descriptions thereof may be omitted for brevity.

Referring to FIGS. 6a-6g, the evaporator stack 26e may include a number of inclined walls. For example, the evaporator stack 26e may include a first inclined wall 26IW1, a second inclined wall 26IW2, a third inclined wall 26IW3, and a fourth inclined wall 26IW4.

Each of the inclined walls 26IW1-26IW4 may be connected to respective ones of the vertical walls 26W1-26W4. The inclined walls 26IW1 to 26IW4 may be inclined with respect to each other. For example, the first inclined wall 26IW1 may be inclined with respect to the third inclined wall 26IW3, and the second inclined wall 26IW2 may be inclined with respect to the fourth inclined wall 26IW4.

The inclined walls 26IW1 to 26IW4 may be on the respective vertical walls 26W1 to 26W4.

There may be an inclined beveled portion between each of the respective inclined walls. For example, there may be an inclined beveled portion 26IBP between the first inclined wall 26IW1 and the second inclined wall 26IW2.

Although the inclined beveled portions 26IBP are illustrated as being rounded, example embodiments are not limited thereto. For example, the inclined beveled portions 26IBP may include sharp angles, and/or may not be rounded/curved.

There may be a ringed wall 26RW on the inclined walls 26IW1 to 26IW4. The ringed wall 26RW may have a cylindrical shape, e.g. may be substantially cylindrical. A height of the ringed wall 26RW may be about 5-10 mm, and a thickness of the ringed wall 26RW may be about 1 mm. An inner diameter of the ringed wall 26RW may be about 15-30 mm, e.g. may be about 22 mm; however, example embodiments are not limited thereto. A thickness of the ringed wall 26RW may be the same as, or similar to, thicknesses of other walls such as those of the first wall 26W1. Dimensions of the ringed wall 26RW, such as thicknesses and diameters, may be appropriate to accommodate a sealing surface to other components of the electronic assembly 111, such as those of a collection manifold 36, to be described below with reference to FIGS. 8a-8b.

As shown in FIGS. 6a-6g, for example as shown in the cross-sections of FIGS. 6d-6f, the mounded portion 26MP may have an irregular shape. For example, the mounded portion 26MP may have a shape as a saddle, e.g. may include a saddle point as described above with respect to evaporator stack 26d illustrated in FIGS. 5a and 5b.

The evaporator stack 26e may have an evaporator stack vertical axis 26VA that extends vertically. The evaporator stack 26e axis may be coaxial with the substantially cylindrical portion or the substantially cylindrical evaporator stack 26e.

Each of the components of the evaporator stack 26e may be integrally formed. For example, each of the plurality of fins 26F, the enclosure 26ENC including the vertical walls 26W1-26W4, the mounded portion 26MP, the ringed wall 26RW, the inclined walls 26IW1-26IW4, the inclined beveled portion 26IBP, the beveled vertical portion 26BVP may be integrally formed, and may be formed of a metal or a metal alloy.

Each of the evaporator stacks 26a-26e may be formed with a die-cast mold, and/or may be formed with a three-dimensional (3D) printing process. As an example, the mounded portion 26MP may be defined by about seven spline sketches, e.g. about seven 5-point spline sketches. Alternatively, individual components may be separately fabricated, and may be soldered and/or brazed together.

The evaporator stacks 26a-26e may be formed of a metal such copper, aluminum, gold, alloys thereof, a sub-combination thereof, or a combination thereof. There may be a microporous layer including a powdered carbon in a matrix on surfaces of the metallic material. The microporous layer may enable enhanced thermal dissipation.

Furthermore as illustrated in FIGS. 6d, 6e, and 6f, the mounded portion 26MP may have an asymmetrical shape. For example, the mounded portion 26MP illustrated in FIG. 6d may have an asymmetrical shape with respect to line C-C'; the mounded portion 26MP illustrated in FIG. 6e may have an asymmetrical shape with respect to FIGS. D-D'; and the mounded portion 26MP illustrated in FIG. 6f may have an asymmetrical shape with respect to line E-E'. An asymmetrical shape of the mounded portion 26MP may lead to improved heat dissipation.

Figure 7:
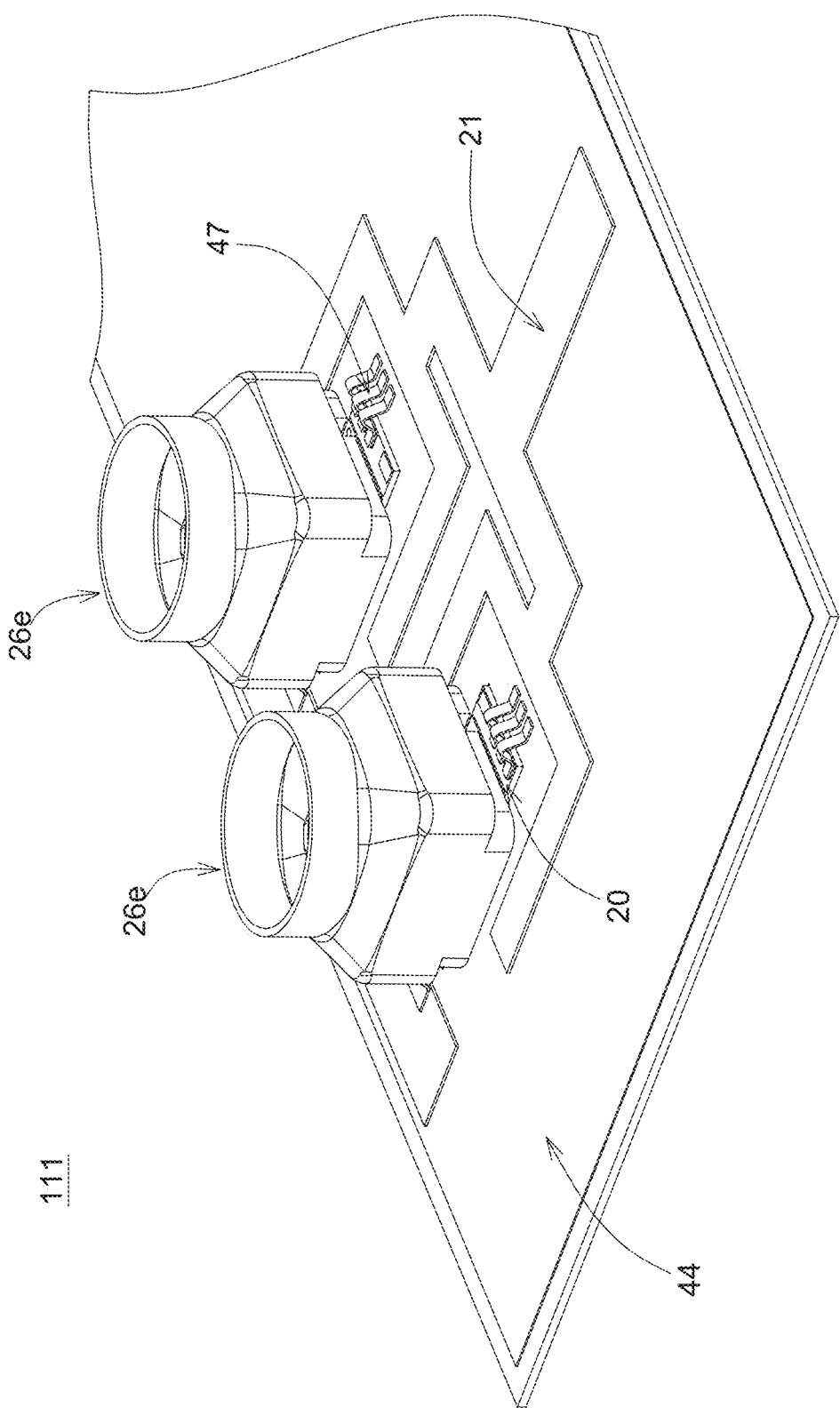

FIG. 7 illustrates an enlarged view of an electronic assembly 111, according to some example embodiments.

Referring to FIG. 7 the electronic assembly 111 may include a plurality of evaporators 26 situated on top of respective pluralities of semiconductor devices 20.

Although FIG. 7 illustrates evaporator stacks 26e, example embodiments are not limited thereto. For example, evaporator stacks may correspond to the same, or different, evaporator stacks 26a-26e described above with respect to FIGS. 2-6.

The semiconductor devices 20 may be situated on a circuit board 44. In FIG. 7, the semiconductor device 20 has device terminals that are electrically connected to terminals 47, such as lead frame terminals. The circuit board 44 may further include traces such as metallic traces 21.

The terminals 47 in conjunction with the traces 21 may correspond to interconnects. These interconnects may be electrical connections, e.g. electrical power connections, between the semiconductor device 20 and DC bus capacitors, or between the semiconductor device 20 and DC/AC power terminals such as the DC port 90 or the AC port 92.

The evaporator stack 26 may resemble a miniature cooling tower or stack that is mountable on a circuit board or other substrate.

Figure 8B:
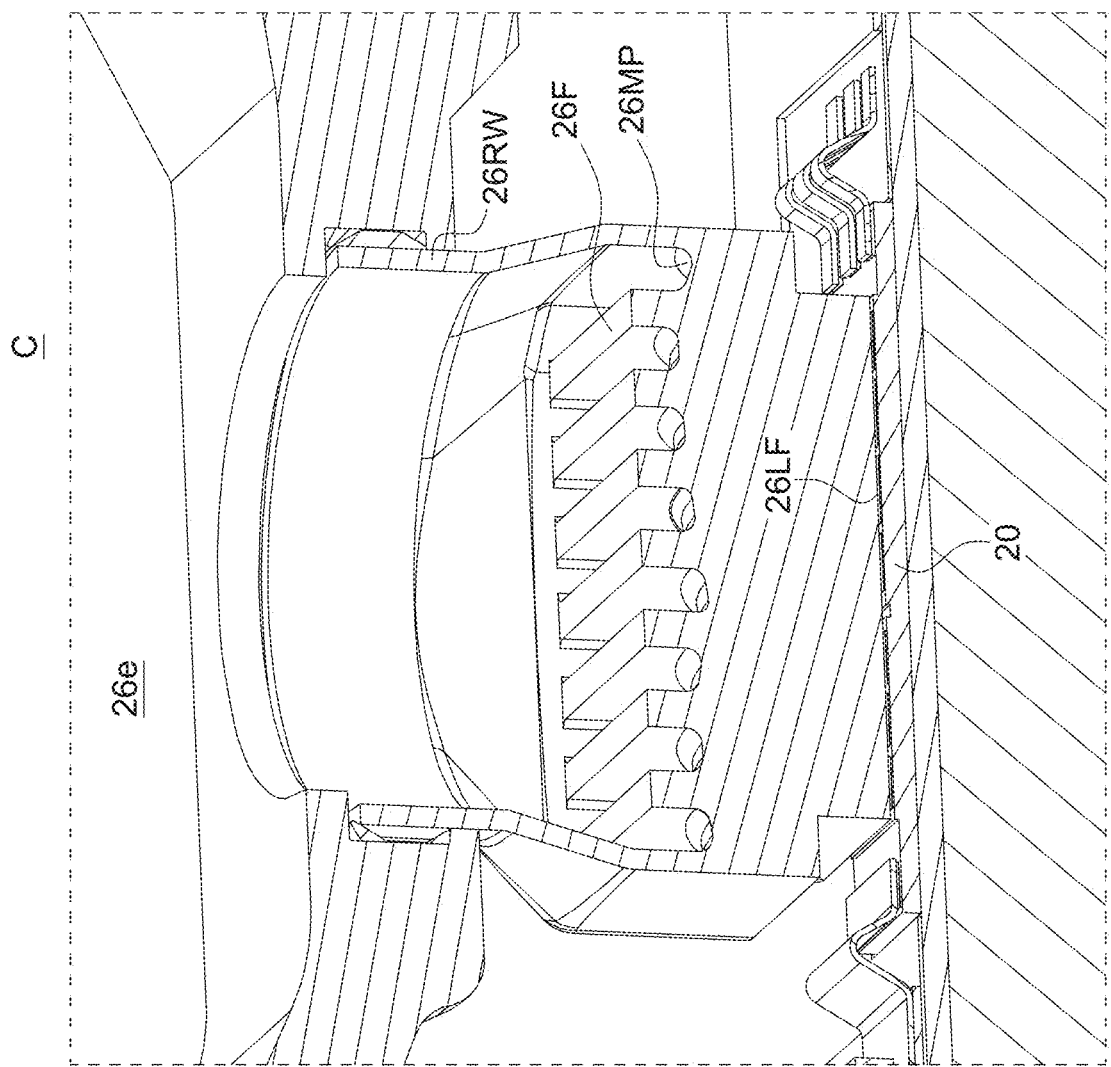

FIG. 8a is a cut-away view of an electronic assembly, according to some example embodiments, and FIG. 8b is a zoom-in of the portion of FIG. 8a labelled "C".

Referring to FIGS. 8a and 8b, the electronic assembly 111 may include a condenser 120, the AC port 92, at least one semiconductor device 20, and at least one evaporator stack 26.

Although FIGS. 8a and 8b illustrate an evaporator stack 26e, example embodiments are not limited thereto. For example, the evaporator stack may correspond to the same, or different, evaporator stacks 26a-26e described above with respect to FIGS. 2-6.

Evaporator stacks 26e may be situated under the condenser 120. An evaporator stack 26 overlies the first side of the semiconductor device 20. The lower floor 26LF of the evaporator stack 26e may be heated by heat generated by the semiconductor device 20. The evaporator stack 26e may convert a liquid-phase of a coolant into a gas-phase of the coolant. The heat generating semiconductor device 20 is predominately cooled by the two-phase cooling.

In some example embodiments, the electronic assembly 111 supports the circulation of a coolant 34 (e.g., refrigerant) without any pump. Arrows 35 show the direction of heat flow away from a heat-generating semiconductor device 20. The coolant 34 may convert to a vapor phase within the collection manifold 36. Furthermore, arrows 38 show the direction of heat flow from the collection manifold 36 to within the condenser 120. The coolant 34, in vapor form, may condense within the condenser 120.

As described above with reference to FIG. 2, the mounded portion 26MP included in the evaporator stack 26e may help evaporation of the coolant 34 in a direction conformal to the shape of the mounded portion 26MP, and there may be reduced amount of localized heating of the coolant 34.

Furthermore, the collection manifold 36 comprises a sloped floor 70 that allows condensation of the coolant 34 formed on interior surfaces of the collection manifold 36 and/or within the condenser 120, to drain back to the evaporator stack 26 by gravity. The coolant 34 forms or is capable of forming on the collection manifold 35, and/or within the condenser 120, when a liquid phase changes back to a gas phase. The coolant 34 may nucleate and condense into liquid-phase on surfaces of the collection manifold 36 and/or within the condenser 120.

In some example embodiments, the phase-change of the coolant 34 transitions to a gas-phase in the evaporator stack 26, transitions to a liquid-phase in the collection manifold 36 and/or within the condenser 120, and returns by gravity to the evaporator stack 26 in liquid-phase. Accordingly, the coolant 34 is circulated by phase-change of the coolant 34, the surface 72 of the collection manifold 36, and without any pump.

The lower floor 26LF of the evaporator stack 26 may be in thermal communication with a respective semiconductor device 20. Evaporation and condensation modes may occur simultaneously, particularly when condensed coolant 34 drips down the wall or sides of the evaporator stack 26 (e.g., from the collection manifold 36) toward the first side of the semiconductor device 20. Sometimes, the coolant 34 may appear to condense on the wall or sides of the evaporator stack 26.

In the evaporator stack 26, the coolant 34 changes phase from a liquid-phase to a gas-phase, while absorbing heat. In a collection manifold 36 and/or condenser 120, the coolant 34 changes phase from a gas-phase to the liquid-phase by cooling the coolant 34. The condensed coolant 34 or condensation forms in the condensation zone or condensation volume within the collection manifold 36 or on the interior surfaces 72 of the collection manifold 36, and/or within the condenser 120

The coolant 34 may be cooled. There may be a fan (not illustrated) that generates airflow above the condenser 120, and the airflow may cause condensation of the coolant. For example, the coolant 34 may condense within the condenser 120 into liquid-phase. The liquid-phase of the coolant may collect within the collection manifold 36. The liquid-phase of the coolant may be directed, e.g. may be direct by gravity, towards the evaporator 26.

The condenser 120 may be in communication with the evaporator stack 26. The condenser 120 may be arranged to receive a gas-phase or vapor-phase of the coolant. The condenser 120 may be configured to cool and/or convert the received gas-phase of the coolant into a liquid phase to replenish the liquid-phase coolant for interaction with the lower floor 26LF of the evaporator stack 26. There may not be a pump that actively supplies coolant. The electronic assembly 111 may utilize a passive cooling system, and may not utilize an active cooling system that includes a pump.

Having described various example embodiments, it will become apparent that various modifications can be made without departing from the scope of the invention as defined in the accompanying claims.

What is claimed is:

1. An evaporator stack comprising:
   a lower floor including at least one mounded portion; and
   an enclosure surrounding the lower floor, wherein a height of the enclosure is greater than a height of the at least one mounded portion, the at least one mounded portion extending from a first vertical wall to a second vertical wall of the enclosure,
   wherein an outlet of the evaporator stack is above the at least one mounded portion.

2. The evaporator stack of claim 1, wherein the enclosure comprises:
   a third vertical wall; and
   a fourth vertical wall facing the third vertical wall, wherein
   the first vertical wall faces the second vertical wall.

3. The evaporator stack of claim 2, wherein the first vertical wall intersects the third vertical wall, the third vertical wall intersects the second vertical wall, and the fourth vertical wall intersects the first vertical wall.

4. The evaporator stack of claim 2, wherein
   the lower floor includes a plurality of flat portions,
   the third vertical wall is adjacent to a first flat portion of the plurality of flat portions, and
   the fourth vertical wall is adjacent to a second flat portion of the plurality of flat portions.

5. The evaporator stack of claim 1, wherein
   the lower floor includes at least one flat portion, and
   an edge between at least one of the at least one flat portion and at least one of the at least one mounded portion is curved.

6. The evaporator stack of claim 1, wherein the enclosure and the lower floor are integrally formed.

7. The evaporator stack of claim 1, wherein the enclosure includes a metallic material, the metallic material including copper, aluminum, gold, alloys thereof, a sub-combination thereof, or a combination thereof.

8. The evaporator stack of claim 7, further comprising:
   a microporous layer including a powdered carbon in a matrix, the microporous layer on surfaces of the metallic material.

9. The evaporator stack of claim 1, wherein the enclosure includes a third vertical wall, and fourth vertical wall facing the third vertical wall, wherein the first vertical wall faces the second vertical wall, and the evaporator stack further comprises:
   a first inclined wall on the first vertical wall;
   a second inclined wall on the third vertical wall;
   a third inclined wall on the second vertical wall; and
   a fourth inclined wall on the fourth vertical wall, wherein
   the first inclined wall and the third inclined wall are inclined in a direction toward each other, and
   the second inclined wall and the fourth inclined wall are inclined in a direction towards each other.

10. The evaporator stack of claim 9, further comprising:
    a ringed wall on the first inclined wall, the ringed wall having a substantially cylindrical shape.

11. The evaporator stack of claim 9, further comprising:
    a first inclined beveled portion between the first inclined wall and the second inclined wall.

12. The evaporator stack of claim 9, wherein the first vertical wall, the second vertical wall, the third vertical wall, and the fourth vertical wall are not inclined with respect to each other.

13. The evaporator stack of claim 9, wherein a length of the first vertical wall is based on a dimension of a semiconductor device.

14. The evaporator stack of claim 9, further comprising:
    a first beveled vertical portion between the first vertical wall and the third vertical wall.

15. The evaporator stack of claim 9, wherein
    a top surface of the first vertical wall is planar with a top surface of the third vertical wall, and
    a bottom surface of the first vertical wall is lower than a bottom surface of the third vertical wall.

16. An evaporator stack comprising:
    a lower floor;
    an enclosure surrounding the lower floor; and
    a plurality of linear fins extending horizontally on the lower floor,
    the lower floor comprises at least one flat portion and at least one mounded portion, and
    a height of at least one of the plurality of linear fins is greater than a height of the at least one mounded portion, the height of the at least one of the plurality of linear fins is less than a height of the enclosure, and the at least one mounded portion runs from a first vertical wall to a second vertical wall of the enclosure.

17. The evaporator stack of claim 16, wherein the plurality of linear fins extend parallel to one another.

18. An electronic assembly comprising:
    at least one semiconductor device including at least one of a silicon power semiconductor chip, a silicon carbide power semiconductor chip, or a gallium nitride power semiconductor chip; and
    an evaporator stack on the at least one semiconductor device, the evaporator stack including,
    a lower floor including at least one mounded portion, and
    an enclosure surrounding the lower floor and connected to the at least one mounded portion, a height of the enclosure being greater than a height of the at least one mounded portion, wherein the at least one mounded portion extends from a first vertical wall to a second vertical wall of the enclosure, and an outlet of the evaporator stack is above the at least one mounded portion.

19. The electronic assembly of claim 18, further comprising:

interconnects connecting the at least one semiconductor device to at least one of a DC bus capacitor or DC and AC ports.

\* \* \* \* \*